United States Patent
Cheng et al.

(10) Patent No.: US 9,397,095 B1
(45) Date of Patent: Jul. 19, 2016

(54) POWER AND DIE SIZE OPTIMIZATION IN FINFETS

(71) Applicant: Altera Corporation, San Jose, CA (US)

(72) Inventors: Ning Cheng, San Jose, CA (US); Andy Lee, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/222,630

(22) Filed: Mar. 22, 2014

(51) Int. Cl.
| | |
|---|---|
| H01L 29/06 | (2006.01) |
| H01L 27/088 | (2006.01) |
| H01L 27/118 | (2006.01) |
| H01L 27/02 | (2006.01) |

(52) U.S. Cl.
CPC ........ *H01L 27/0886* (2013.01); *H01L 27/0207* (2013.01); *H01L 27/11803* (2013.01)

(58) Field of Classification Search
CPC .................. H01L 27/0886; H01L 27/11803; H01L 27/0207

USPC .......................................... 257/401, 618, 623
See application file for complete search history.

(56) References Cited

U.S. PATENT DOCUMENTS

2010/0025767 A1* 2/2010 Inaba ............................ 257/365

* cited by examiner

*Primary Examiner* — Hung Vu

(57) ABSTRACT

A FinFET comprises a substrate, an array of substantially parallel fins formed on the substrate and extending in a first direction, and an array of gates on the fins. First gates extend across the same fins of a first plurality of the fins in a second direction transverse to the first. Second gates extend across the same fins of a second plurality of fins in the second direction; the second gates having a length that is larger than that of the first gates. Third gates extend across the same fins of a third plurality of fins in the second direction; the third plurality of fins being located between the first and second pluralities. The third gates provide a transition between the first gates and the second gates in which a first portion of the third gates are dummies and a second portion are active devices such as pass gates.

19 Claims, 5 Drawing Sheets

US 9,397,095 B1

POWER AND DIE SIZE OPTIMIZATION IN FINFETS

BACKGROUND

When lithography is used to make devices having regular arrays of extremely small feature pitches such as less than 150 nanometers (nm.), devices having different feature pitches will produce unwanted imaging effects and etching effects unless the devices are well separated. As a result the practice in the art is to introduce transition regions between the larger size devices and the smaller size devices. This practice is widely used in the semiconductor industry. However, the use of transition regions imposes a significant cost in that it requires the use of a larger integrated circuit to accommodate the transition regions.

SUMMARY

The present invention reduces the space that is wasted in transition regions. It is useful in FinFET devices (a/k/a tri-gate devices) and will be described in that context. It may also be useful elsewhere such as in planar gate all around (GAA) devices.

In one embodiment, a FinFET comprises a substrate, an array of substantially parallel fins formed on the substrate and extending in a horizontal direction, and an array of gates on the fins. First gates extend across the same fins of a first plurality of the fins in a second direction substantially transverse to the first direction. Second gates extend across the same fins of a second plurality of fins in the second direction; the second gates having a length that is larger than the length of the first gates. Third gates extend across the same fins of a third plurality of fins in the second direction; the third plurality of fins being located between the first and second pluralities of fins. The third gates provide a transition between the first gates and the second gates in which a first portion of the third gates are dummies and a second portion are active devices such as pass gates In a second embodiment, the first, second and third gates are all formed on the same fins.

Advantageously, the larger gates may be used in the transistors of RAM cells, thereby reducing source-drain and band-to-band leakage observed with gates of shorter dimension. Such leakage results in power loss and heating. By using some of the transition region for active circuits, these reductions in power loss and heating can be attained with very little increase in die size.

Numerous variations may be practiced in the preferred embodiments.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
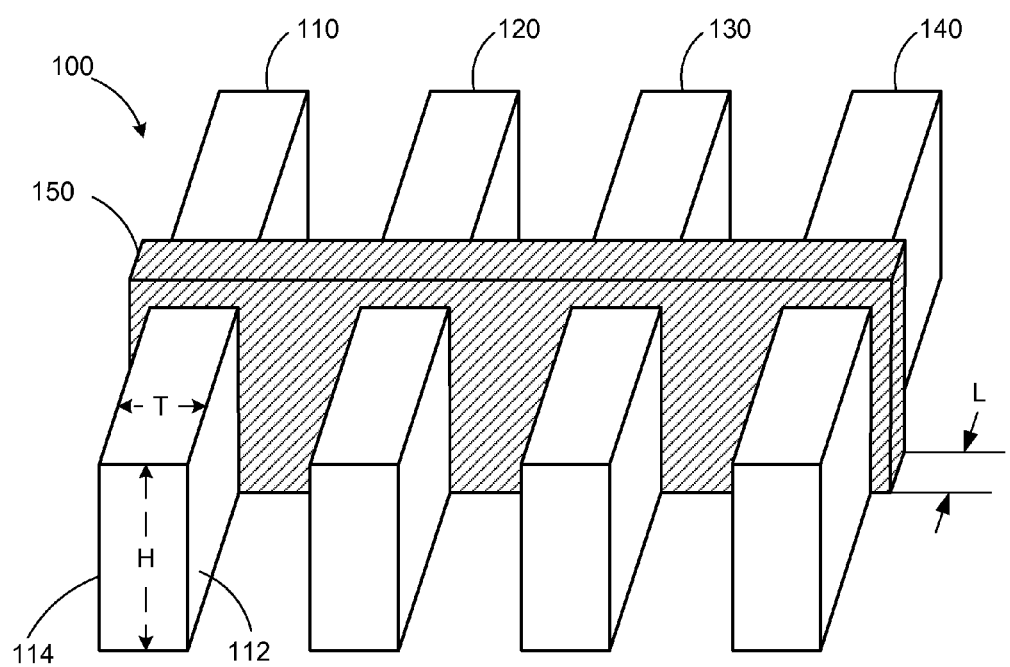
FIG. 1 is a perspective view of an illustrative embodiment of a FinFET.

FIG. 1 depicts an illustrative FinFET 100 comprising four fins 110, 120, 130, 140 and a common gate structure 150. The fins have first and second major surfaces, such as surfaces 112, 114, that are opposite one another and usually are symmetric about a center plane that bisects the fin lengthwise. Major surfaces 112, 114 are often illustrated as being parallel as in U.S. Pat. No. 7,612,405 B2 or Pub. No. US2008/0128797 A1, which are incorporated herein by reference; but process limitations usually result in surfaces that slope outwardly from top to bottom of the fin with the result that the cross-section of the fin is trapezoidal in shape. In some cases, sidewalls 112, 114 meet at the top. FinFET 100 has a common gate structure. In other embodiments, a separate gate structure may be located on each surface of each fin. The width of the gate structure 150 shown in FIG. 1 can be as much as N(T+2H) where N is the number of fins, T is the distance, if any, between the first and second major surfaces of the fin and H is the height of the fin. The length of the gate structure is L.

Doped source and drain regions are located on opposite sides of the gates. As in a planar FET, a voltage applied to the gate controls current flow in an un-doped channel that extends between the doped source and drain regions in the semiconductor beneath the gate.

Figure 2:
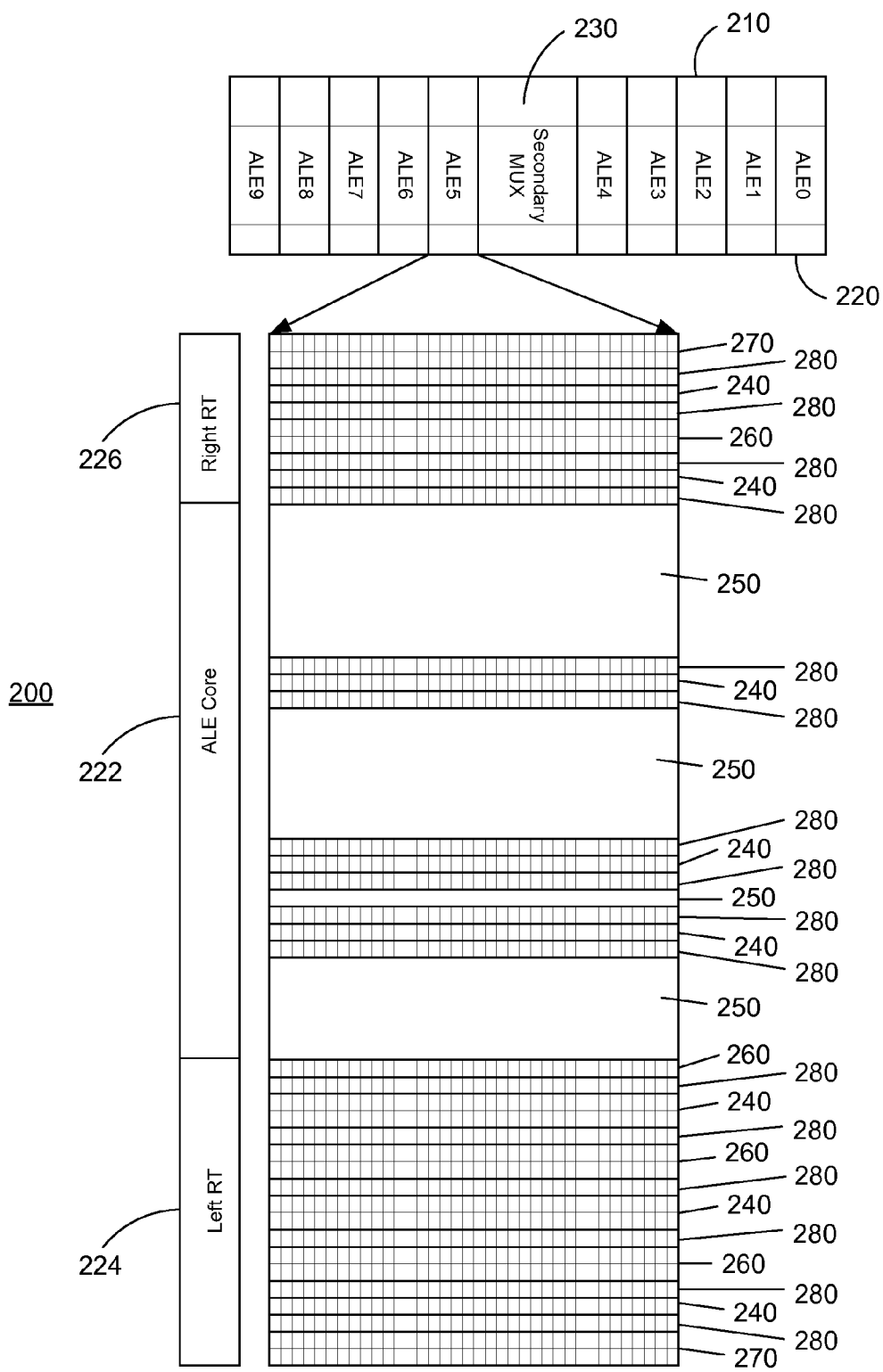
FIG. 2 is a schematic view of an illustrative embodiment of a logic element of a field programmable gate array.

FIG. 2 is a top view of a portion of an illustrative embodiment of a field programmable gate array (FPGA) 200. The portion shown is one of the logic array blocks (LAB) 210 of the FPGA. LAB 210 comprises ten logic elements 220 that are numbered ALE0-ALE9 and a secondary mux 230. Each logic element 220 comprises a core 222 and left and right routing mux circuitry 224, 226. FIG. 2 includes an exploded view of logic element ALE5.

Each logic element is formed as part of a FinFET. In the illustration of FIG. 2, the fins of the FinFET are substantially parallel and run in the horizontal direction between logic elements ALE0 and ALE9. Gates are formed on the fins that extend in a substantially transverse direction. Each of the logic elements includes random logic, static RAM cells, routing muxes and routing drivers. For an efficient layout and efficient operation, it is important that these circuit elements be located in close proximity to one another. However, the gates of the transistors that form the RAM cells are longer than the gates of the other circuit elements to reduce source-drain and band-to-band leakage and thereby reduce power loss and resultant heating while the gates of the other circuit elements preferably have a length that is near the minimum feature length that can be achieved using the available semiconductor fabrication technology so as to achieve the fastest speed. In this circumstance, the different sizes of the gates will produce unwanted imaging effects and etching effects unless they are separated. As a result, the practice in the art is to introduce transition regions between the long gate circuit elements such as the RAM cells and the short gate circuit elements such as the random logic, routing muxes and routing drivers.

In the exploded view of logic element ALE5, the RAM cells are identified as horizontal rows 240, the random logic by element number 250, the routing muxes as horizontal rows 260 and the routing drivers as horizontal rows 270. Between the RAM cells and the other elements are sixteen horizontal transition regions 280 that extend across the logic element In a state-of-the art FPGA, each transitional region 280 extends approximately one micron in the vertical direction and may encompass about 15-40 fins of the FinFET. Thus, it is apparent that a significant amount of die space is required to accommodate the transitional regions. This results in die size increases on the order of five to thirty percent (%).

Figure 3:
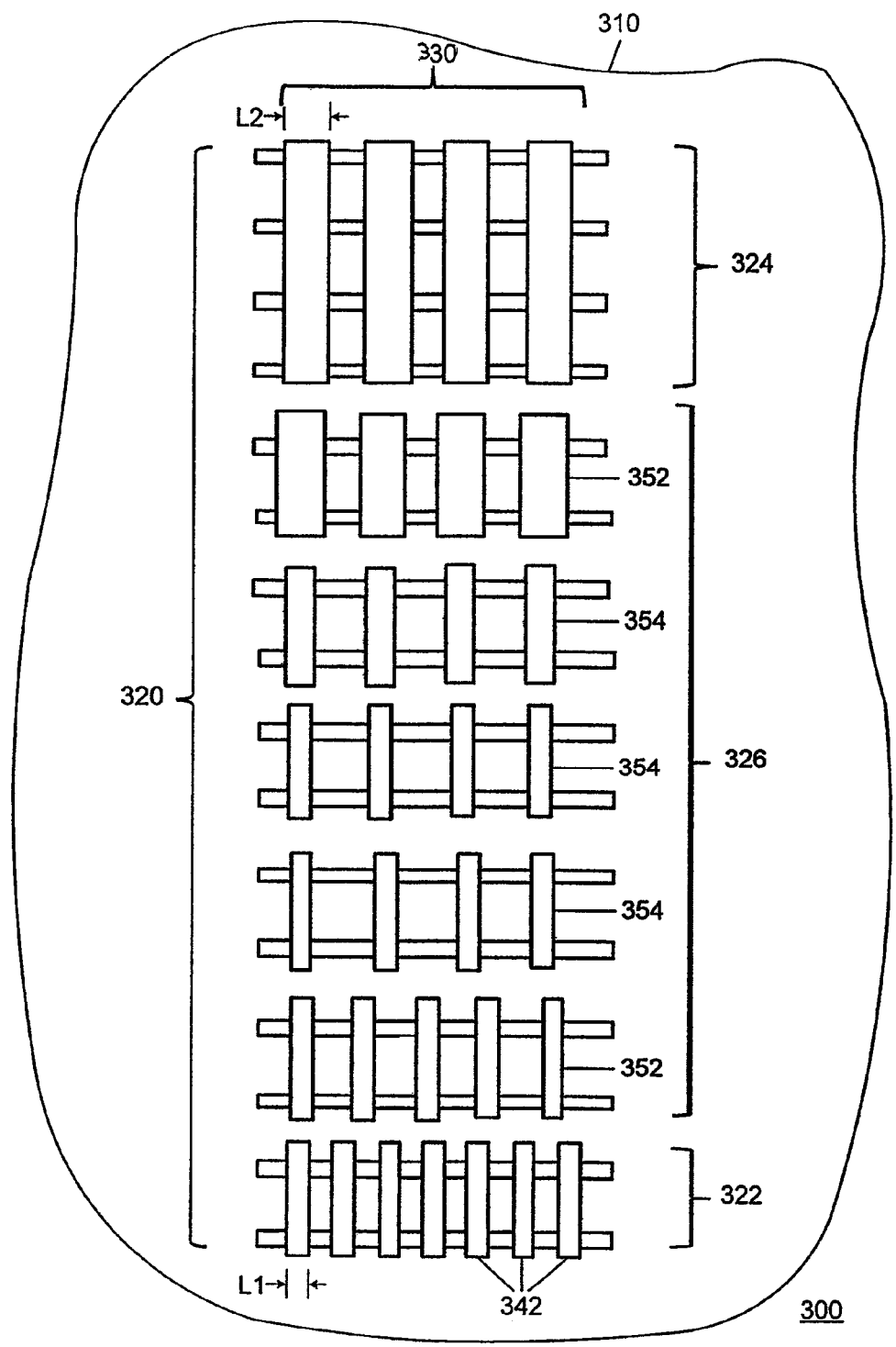
FIG. 3 is a top view of a first illustrative embodiment of the invention.

In one embodiment, some of the die space that would otherwise be lost to the transitional region is recaptured by placing less critical circuitry within the transitional region. FIG. 3 depicts a portion of a FinFET 300 comprising a substrate 310, an array 320 of substantially parallel fins formed on the substrate and extending in a horizontal direction, and an array 340 of gates on the fins. The array of fins comprise a first plurality 322 of fins that are adjacent one another, a second plurality 324 of fins that are adjacent one another, and a third plurality 326 of fins that are adjacent one another and located between the first and second pluralities of fins.

First gates 342 extend across the same fins of the first plurality 322 of fins in a second direction substantially transverse to the first direction. Gates 342 have a length $L_1$. Second gates 344 extend across the same fins of the second plurality 324 of fins in the second direction, the second gates having a length $L_2$ that is larger than length $L_1$. Illustratively, $L_2$ may be from 1.1 to more than 5× larger than $L_1$. Third gates 346 extend across the same fins of the third plurality 326 of fins in the second direction, the third gates providing a transition between the first gates 342 on the first plurality 322 of fins and the second gates 344 on the second plurality 324 of fins.

Third gates 346 comprise a first portion 352 of gates that are dummies (or inactive gates) and a second portion 354 of third gates that are active. As shown in FIG. 3, some of the first portion 352 of gates are located between the first gates 342 and the second portion 354 of third gates and others of the first portion of gates are located between the second gates 344 and the second portion of third gates. In the embodiment illustrated in FIG. 3, gates 354 are pass gates.

Figure 4:
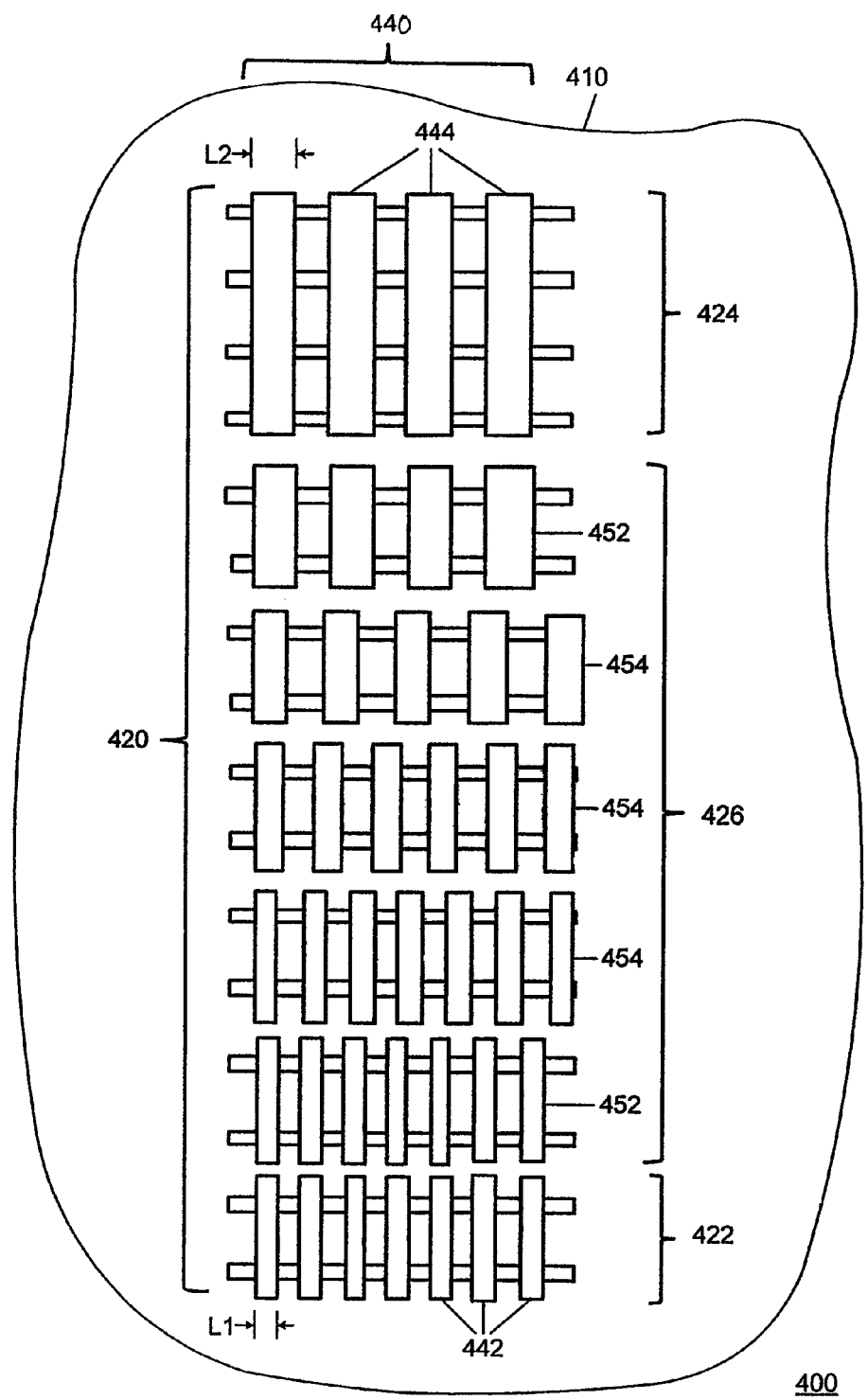
FIG. 4 is a top view of a second illustrative embodiment of the invention.

FIG. 4 depicts a portion of a FinFET 300 comprising a substrate 410, an array 420 of substantially parallel fins formed on the substrate and extending in a horizontal direction, and an array 440 of gates on the fins. The array of fins comprise a first plurality 422 of fins that are adjacent one another, a second plurality 424 of fins that are adjacent one another, and a third plurality 426 of fins that are adjacent one another and located between the first and second pluralities of fins.

First gates 442 extend across the same fins of the first plurality 422 of fins in a second direction substantially transverse to the first direction. Gates 442 have a length $L_1$. Second gates 444 extend across the same fins of the second plurality 424 of fins in the second direction, the second gates having a length $L_2$ that is larger than $L_1$. Again, $L_2$ may be from 1.1 to more than 5× larger than $L_1$. Third gates 446 extend across the same fins of the third plurality 426 of fins in the second direction, the third gates providing a transition between the first gates 442 on the first plurality 422 of fins and the second gates 444 on the second plurality 424 of fins.

Third gates 446 comprise a first portion 452 of gates that are dummies (or inactive gates) and a second portion 454 of third gates that are active. As shown in FIG. 4, some of the first portion 452 of gates are located between the first gates 442 and the second portion 454 of third gates and others of the first portion of gates are located between the second gates 444 and the second portion of third gates. In the embodiment illustrated in FIG. 4, gates 454 form non-critical random logic or decoupling capacitors.

Figure 5:
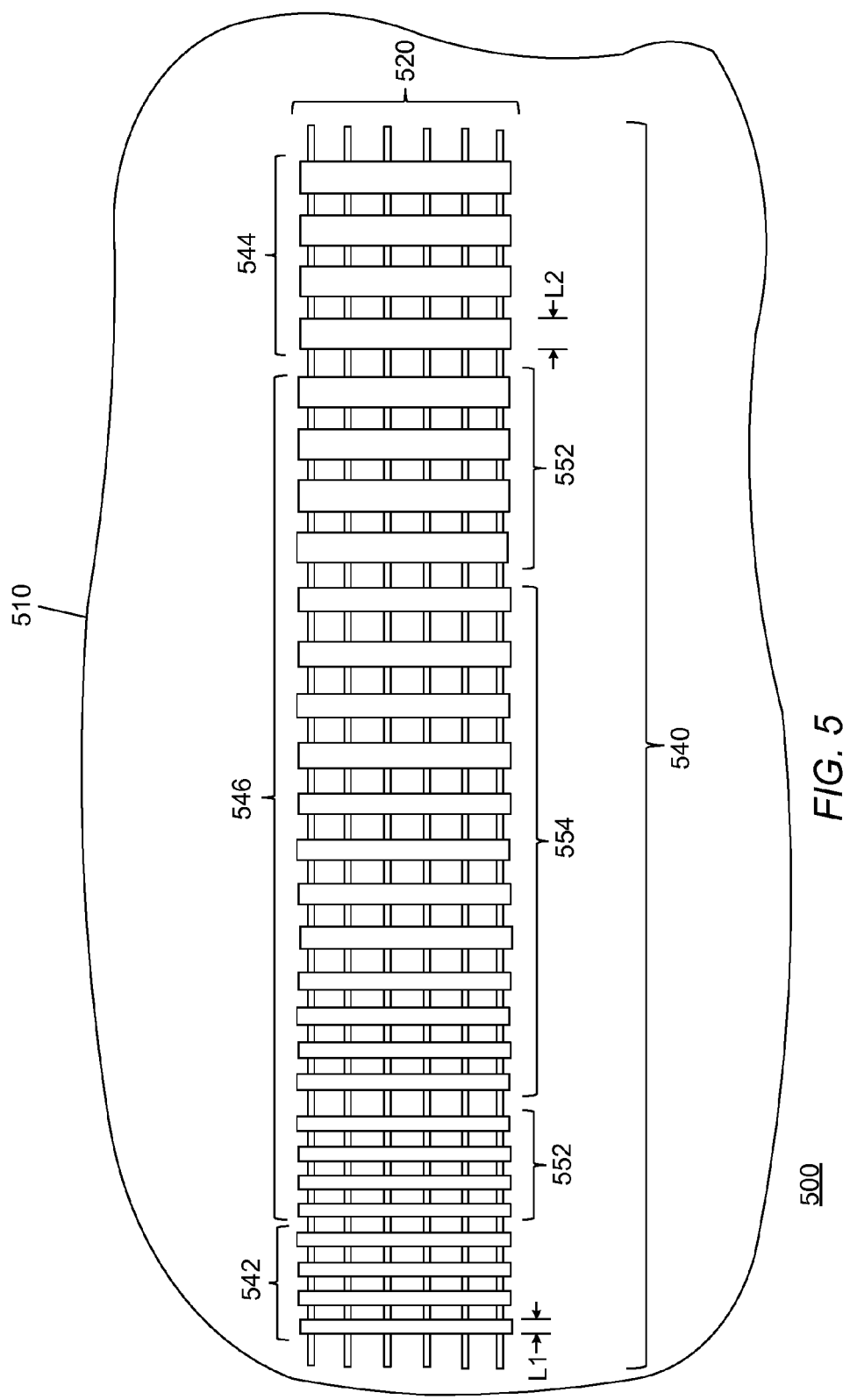
FIG. 5 is a top view of a third illustrative embodiment of the invention.

FIG. 5 depicts a portion of a FinFET 500 comprising a substrate 510, an array 520 of substantially parallel fins formed on the substrate and extending in a horizontal direction, and an array 540 of gates on the fins. In this embodiment, the gates are all formed on the same fins.

First gates 542 extend across the same fins of array 520 in a second direction substantially transverse to the first direction. Gates 542 have a length $L_1$. Second gates 544 extend across the same fins of the array in the second direction, the second gates having a length $L_2$ that is larger than length $L_1$. Again, $L_2$ may be from 1.1 to more than 5× larger than $L_1$. Third gates 546 extend across the same fins of the array in the second direction, the third gates providing a transition between the first gates 542 on the first plurality 522 of fins and the second gates 544.

Third gates 546 comprise a first portion 552 of gates that are dummies (or inactive gates) and a second portion 554 of third gates that are active. As shown in FIG. 5, some of the first portion 552 of gates are located between the first gates 542 and the second portion 554 of third gates and others of the first portion of gates are located between the second gates 544 and the second portion of third gates. In the embodiment illustrated in FIG. 5, gates 554 form pass gates, non-critical random logic or decoupling capacitors.

As will be apparent to those skilled in the art, numerous variations may be practiced within the spirit and scope of the present invention. For example, other devices may be used as the active devices in the transition regions such as transistors that are not susceptible to process variations or transistors with known characteristics that can be compensated for. In addition, the vertical oriented structures illustrated in FIGS. 3 and 4 may be combined with the horizontally oriented structure illustrated in FIG. 5. And, numerous semiconductor materials may be used in the practice of the invention such as silicon, germanium, gallium arsenide, indium phosphide, indium gallium arsenide and other III-V compounds.

What is claimed is:

1. A FinFET comprising:
a substrate;
a first plurality of substantially parallel fins formed on the substrate and extending in a first direction;
first gates extending across the same fins in a second direction substantially transverse to the first direction;
a first plurality of the first gates having a first gate length that is approximately the minimum critical dimension for the fabrication technology used in making the fins;
a second plurality of the first gates having a second gate length that is larger than the first gate length;
a third plurality of the first gates located between the first plurality of gates and the second plurality of gates, said third plurality of gates providing a transition in gate length between the first gate length and the second gate length;
said third plurality of first gates comprising a first portion of gates that are dummies and a second portion of gates that are active.

2. The FinFET of claim 1 wherein the fins are made of silicon.

3. The FinFET of claim 1 wherein the second portion of gates are random logic.

4. The FinFET of claim 1 wherein the second portion of gates are pass gates.

5. The FinFET of claim 1 wherein the second portion of gates are decoupling capacitors.

6. The FinFET of claim 1 wherein some of the first portion of the third plurality of gates are between the first plurality of gates and the second portion of the third plurality of gates and others of the first portion of the third plurality of gates are between the second plurality of gates and the second portion of the third plurality of gates.

7. A logic element of a field programmable logic array comprising a plurality of cells each cell formed in a FinFET where the FinFET comprises:
- a first plurality of substantially parallel fins formed on a substrate and extending in a first direction;
- first gates extending across the same fins in a second direction substantially transverse to the first direction;
- a first plurality of the first gates having a first gate length that is approximately the minimum critical dimension for the technology used in making the fins;
- a second plurality of the first gates having a second gate length that is larger than the first gate length;
- a third plurality of the first gates located between the first plurality of gates and the second plurality of gates, said third plurality of gates providing a transition in gate length between the first gate length and the second gate length;
- said third plurality of first gates comprising a first portion of gates that are dummies and a second portion of gates that are active.

8. The logic element of claim 7 wherein the fins of the FinFET are made of silicon.

9. The logic element of claim 7 wherein the second portion of gates are random logic.

10. The logic element of claim 7 wherein the second portion of gates are pass gates.

11. The logic element of claim 7 wherein the second portion of gates are decoupling capacitors.

12. The logic element of claim 7 wherein some of the first portion of the third plurality of gates are between the first plurality of gates and the second portion of the third plurality of gates and others of the first portion of the third plurality of gates are between the second plurality of gates and the second portion of the third plurality of gates.

13. A FinFET comprising:
- a substrate;
- a plurality of substantially parallel fins formed on the substrate and extending in a first direction;
- gates extending across the same fins in a second direction substantially transverse to the first direction;
- a first plurality of the gates having a first gate length that is approximately the minimum critical dimension;
- a second plurality of the gates having a second gate length that is larger than the first gate length;
- a third plurality of the gates located between the first plurality of gates and the second plurality of gates, said third plurality of gates having a gate length greater than the first gate length and less than the second gate length;
- said third plurality of gates comprising a first portion of gates that are dummies and a second portion of gates that are active.

14. The FinFET of claim 13 wherein the fins are made of silicon.

15. The FinFET of claim 13 wherein the second portion of gates are random logic.

16. The FinFET of claim 13 wherein the second portion of gates are pass gates.

17. The FinFET of claim 13 wherein the second portion of gates are decoupling capacitors.

18. The FinFET of claim 13 wherein some of the first portion of gates are between the first plurality of gates and the second portion of gates and others of the first portion of gates are between the second plurality of gates and the second portion of gates.

19. A FinFET comprising:
- a substrate;
- a plurality of substantially parallel fins formed on the substrate and extending in a first direction;
- gates extending across the fins in a second direction substantially transverse to the first direction;
- a first plurality of the gates having a first gate length that is approximately the minimum critical dimension;
- a second plurality of the gates having a second gate length that is larger than the first gate length;
- a third plurality of the gates located between the first plurality of gates and the second plurality of gates, said third plurality of gates having a gate length between the first gate length and the second gate length;
- said third plurality of gates comprising a first portion of gates that are dummies and a second portion of gates that are active;
- wherein some of the first portion of gates are located between the first plurality of gates and the second portion of gates and have a gate length that is shorter than the gate length of others of the first portion of gates that are located between the second plurality of gates and the second portion of gates.

\* \* \* \* \*